United States Patent [19]

Munakata et al.

[11] 4,453,181

[45] Jun. 5, 1984

[54] SCANNING-IMAGE FORMING APPARATUS USING PHOTO RESPONSE SIGNAL

[75] Inventors: Chusuke Munakata; Hideki Kohno, both of Tokyo, Japan

[73] Assignee: Hitachi, Ltd., Tokyo, Japan

[21] Appl. No.: 311,889

[22] Filed: Oct. 15, 1981

[30] Foreign Application Priority Data

Oct. 15, 1980 [JP] Japan .................................. 55-145746

[51] Int. Cl.³ .............................................. H04N 7/18
[52] U.S. Cl. .................................... 358/101; 358/209; 358/166; 358/284; 364/732
[58] Field of Search ............... 358/110, 101, 213, 241, 358/209, 166, 106, 284, 280; 364/732

[56] References Cited

U.S. PATENT DOCUMENTS

| | | | |
|---|---|---|---|
| 2,962,550 | 11/1960 | Brink | 358/284 |
| 3,450,885 | 6/1969 | Willes | 358/213 |
| 4,213,155 | 7/1980 | Muenchow et al. | 358/284 |
| 4,335,407 | 1/1982 | Atoti et al. | 358/284 |

Primary Examiner—Tommy P. Chin
Assistant Examiner—Edward L. Coles
Attorney, Agent, or Firm—Antonelli, Terry & Wands

[57] ABSTRACT

A scanning-image forming apparatus using a photo-response signal according to this invention is constructed so that the photo-response signal obtained by scanning the surface of a semiconductor specimen with a photon beam is subjected to a 2nd differentiation, and that an image is displayed by employing the 2nd derivative of the photo-response signal as a modulation signal.

18 Claims, 5 Drawing Figures

SCANNING-IMAGE FORMING APPARATUS USING PHOTO RESPONSE SIGNAL

BACKGROUND OF THE INVENTION

This invention relates to an image forming apparatus which displays at a high resolving power a photo-response signal such as photo-voltage generated by scanning the surface of a semiconductor specimen with a photon beam.

In an apparatus for interpreting an information recorded on an appropriate medium by the use of a particle beam, or an apparatus for characterizing semiconductors by the use of a particle beam, an improvement in the resolving power is an important item when a flying-spot scanning image is formed. The fundamental idea that a specimen is irradiated with the primary beam in the shape of a spot and that a signal generated from the specimen is used for obtaining the scanning image, has heretofore been realized in a scanning electron microscope (hereinbelow, abbreviated to "SEM") by utilizing an electron beam as the primary beam and secondary electrons emitted from the specimen as the signal source. As is well known, in the SEM, the resolving power is determined by the diameter of the electron beam being the primary beam, and hence, the diameter of the primary electron beam is reduced down to several Å (usually made several hundred Å) by employing several stages of electron lenses. Accordingly, unless the specimen is an electrical insulator, the resolving power will not be restricted by the properties of the specimen.

In contrast, in the system in which the scanning image is obtained by utilizing a photo-voltage or the like photo-response signal as the signal source and to which this invention is directed, unless the diameter of a photon beam being the primary beam is extremely great, the resolving power will be determined by the diffusion length of minority carriers in a semiconductor contributive to the generation of the photo-voltage, rather than by the diameter of the photon beam. By way of example, even when the diameter of the photon beam is made infinitesimal, the resolving power does not rise, but the resolving power is determined depending upon the extent to which the minority carriers excited by the photon beam spread. Now, the minority carriers are supposed to be holes, the diffusion length of which is denoted by $L_p$. Then, the formation of the scanning image is, in effect, equivalent to measuring the specimen with a probe which has a diameter of $2 L_p$. Letting r denote the radius of the photon beam, the diameter thereof is 2 r, and $2 r < 2 L_p$ holds in many cases. Regarding the resolving power, therefore, the diameter of the photon beam is not a very important factor. Herein, the concept of the scanning image in this invention becomes basically different from that of the scanning image of the SEM.

The fact that the scanning image utilizing the photo-response signal such as photo-voltage depends upon the diffusion length $L_p$, gives rise to a phenomenon greatly different from the situation of the SEM in another aspect. That is, in case where the diffusion length $L_p$ varies depending upon semiconductor specimens, or in case where the diffusion length $L_p$ varies depending upon places within an identical semiconductor specimen, not only the resolving power changes, but also the absolute values or amplitudes of the signals become sharply different. On the other hand, in the SEM, the mean value of the signal (the secondary electrons) will not considerably change unless the current of the electron beam being the primary beam fluctuates. It is accordingly natural that, in obtaining the scanning image, the gain of a signal amplifier need not be sharply changed.

It is based on the following reason that the variation of the signal in the case of utilizing the photo-response signal such as photo-voltage depends upon the diffusion length $L_p$. It is well known that, when the intensity of light is constant, the density $\Delta P$ of minority carriers to be generated is dependent upon the lifetime $\tau_p$ of the minority carriers. The minority carrier density is given by:

$$\Delta P = K_1 \tau_p \tag{1}$$

Here $K_1$ denotes a proportional factor. When the photo-voltage is indicated by $\Delta V_O$, it is given by the following where B denotes another proportional factor:

$$\Delta V_0 = B \Delta P \tag{2}$$

$$= B \cdot K_1 \cdot \tau_p \tag{2'}$$

On the other hand, the diffusion length $L_p$ is given by the following where $D_p$ denotes a diffusion constant:

$$L_p = \sqrt{D_p \tau_p} \tag{3}$$

From Expressions (2') and (3), therefore, $$\Delta V_0 = B \cdot K_1 \frac{L_p^2}{D_p} \tag{4}$$

holds, and it is understood that the photo-voltage $\Delta V_O$ is proportional to the square of the diffusion length $L_p$. The proportionality of the photo-voltage $\Delta V_O$ to the square of the diffusion length $L_p$ is a phenomenon which is very effective for finding the variation of the diffusion length $L_p$ (namely, the variation of the lifetime $\tau_p$) within an identical semiconductor specimen.

In particle beam recording, however, when the diffusion length $L_p$ varies depending upon the places of the semiconductor wafer, the brilliance of the background (a part where characters etc. are not recorded) of a recorded image or information varies depending upon places. In an extreme case, the brilliance rises partly on a cathode-ray tube for obtaining the recorded image, with the result that the halation arises on a picture. Simultaneously, the resolving power is conspicuously low in that part. Eventually, the interpretation of the recording in the part where the diffusion length $L_p$ is great becomes impossible for the above two reasons. When the gain of a signal amplifier is lowered with the intention of preventing the halation, the brilliance of the other part becomes insufficient, and the formation of the recorded image becomes impossible.

As a countermeasure against the occurrence of such partial extreme deviation in the signal intensity, it is considered to prevent the halation by the use of the so-called logarithmic amplifier having a logarithmic gain. It is apparent, however, that the measure does not afford the essential solution. The reason is that, whereas it is required on one hand to form a recorded image of high contrast on the basis of a minute signal difference, the use of the logarithmic amplifier renders it impossible to uniformly magnify the minute difference of the signals.

In this respect, in the SEM stated before, the magnitude of the signal is determined by the intensity of the electron beam. Therefore, unless the electron beam intensity fluctuates, the brilliance of the background will not extremely change depending upon places.

Further, let's consider a case of sensing uniformity in the p-n junction of a semiconductor (the state in which junction characteristics deteriorate partly). In this case, it is the purpose to sense that the proportional factor B in Expression (4) varies depending upon places. However, when the diffusion length $L_p$ is greatly different depending upon places, the change of the background is too great to extract only the variation of the proportional factor B.

As to the case of sensing the variation of the proportional factor B, the results of concrete experimental study will now be described by mentioning numerical values. FIG. 1 illustrates a case where, in a specimen (semiconductor wafer) 1 having a length l, a width w and a thickness t, a region having a proportional factor $B_O$ exists over a range of a minute length $\Delta l$ in the central part of the specimen in the lengthwise direction thereof. Whether or not the state of $B_O = 0.1 \times B$ can be accurately sensed under the conditions of $l = 100$ mm and $\Delta l = 1$ mm, is illustrated in FIG. 2 as a function of the position $x_O$ of a photon beam 5. In FIG. 2, the axis of ordinates represents the signal voltage, which is normalized by the size $l \cdot w \cdot t$ of the semiconductor specimen 1, the photon flux $\phi$ and the proportional factor B.

According to FIG. 2, it is well illustrated that, as already described, the increase of the diffusion length $L_p$ results in increasing the signal voltage. Simultaneously, the situation is clearly illustrated in which the resolving power lowers to render the part of the proportional factor $B_O$ indistinguishable. In case of $L_p = 0.1$ mm, it is clearly illustrated that the proportional factor $B_O$ is smaller than the proportional factor B. In contrast, at $L_p = 10$ mm, it is illustrated that the discrimination of the proportional factor $B_O$ is impossible. Moreover, the signal intensity increases to approximately $10^4$ times, and it is a fluctuation which cannot be handled with conventional image forming systems. Accordingly, any countermeasure is desired.

SUMMARY OF THE INVENTION

It is accordingly an object of this invention to provide a scanning-image forming apparatus using a photo-response signal which can obviate the two disadvantages described above, that is, (1) which can prevent the lowering of the resolving power due to the increase of the diffusion length $L_p$ and (2) which can suppress the increase of the background signal due to the increase of the diffusion length $L_p$.

In order to accomplish the object, according to this invention, a scanning-image forming apparatus using a photo-response signal is constructed of photon beam generation means for generating a photon beam, photon beam scanning means for scanning a surface of a semiconductor specimen with said photon beam, detection means for detecting the photo-response signal generated in said semiconductor specimen by the scanning with said photon beam, amplification means for amplifying the detected photo-response signal, differential means for providing a 2nd derivative of the amplified photo-response signal, and display means for displaying an image by employing said 2nd derivative of said photo-response signal as a modulation signal.

The construction of this invention has made it possible to provide the scanning-image forming apparatus using a photo-response signal the resolving power of which is remarkably improved.

DETAILED DESCRIPTION

First of all, the basic principle of this invention will be described. As already described by mentioning an example, the image forming system which utilizes a photo-response signal such as photo-voltage generated in a semiconductor specimen by irradiating it with a photo beam has the special feature of the increase in a background signal attendant upon the lowering of the resolving power. The inventor's experiments and study, however, have revealed that the drawback can be eliminated substantially perfectly by the operation of the 2nd differentiation. In other words, it has been revealed that the operation of the 2nd differentiation bestows the advantage found anew, on the image forming system which utilizes the photo-response signal such as photo-voltage.

Figure 2:
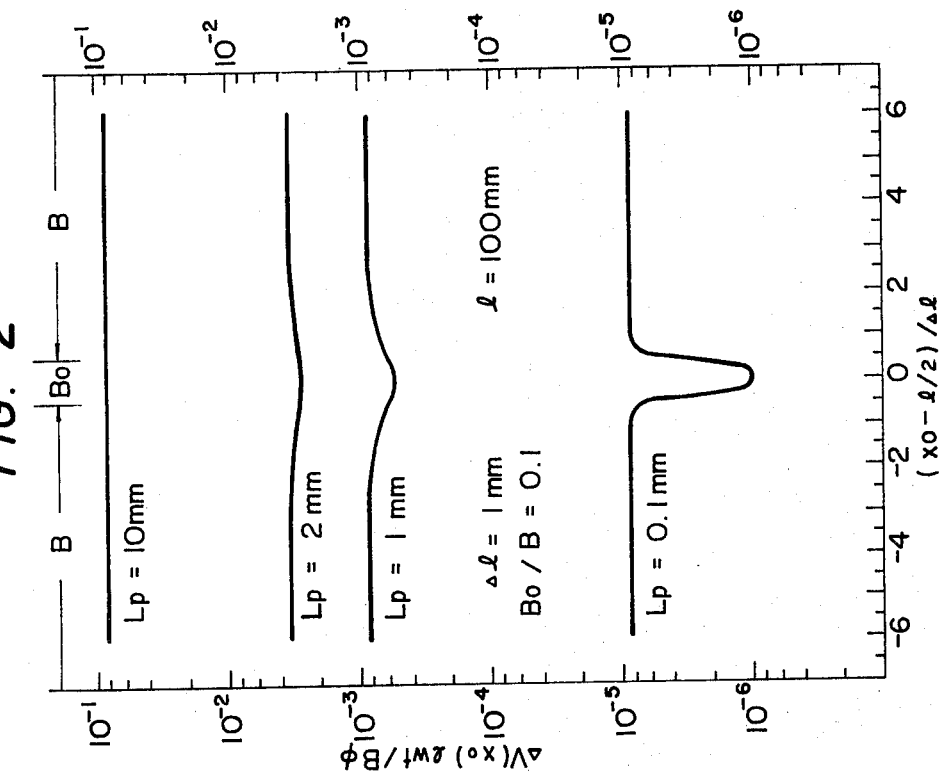
FIG. 2 is a graph illustrating the relationships between the irradiation point of a photon beam and the generated photo-voltage in the semiconductor wafer shown in FIG. 1.
Figure 1:
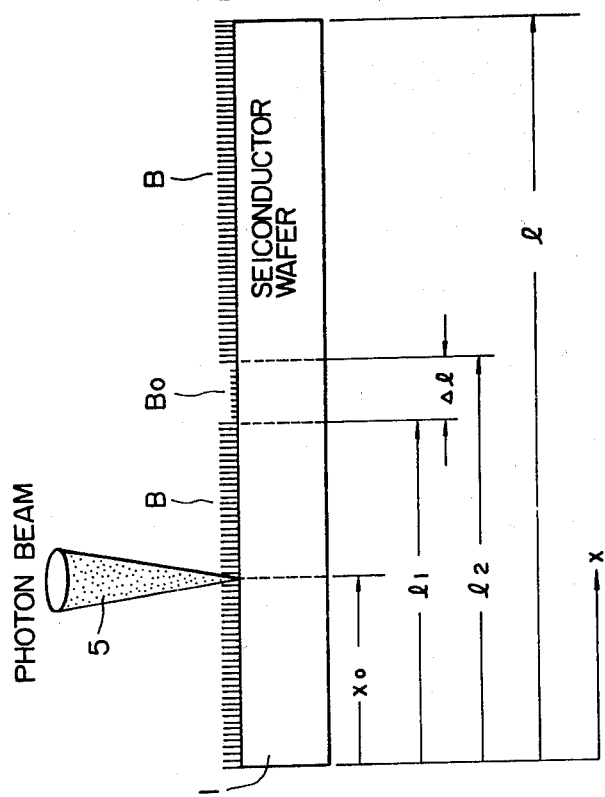
FIG. 1 is a sectional view of a semiconductor wafer for explaining that a photo-voltage differs depending upon places.
Figure 3:
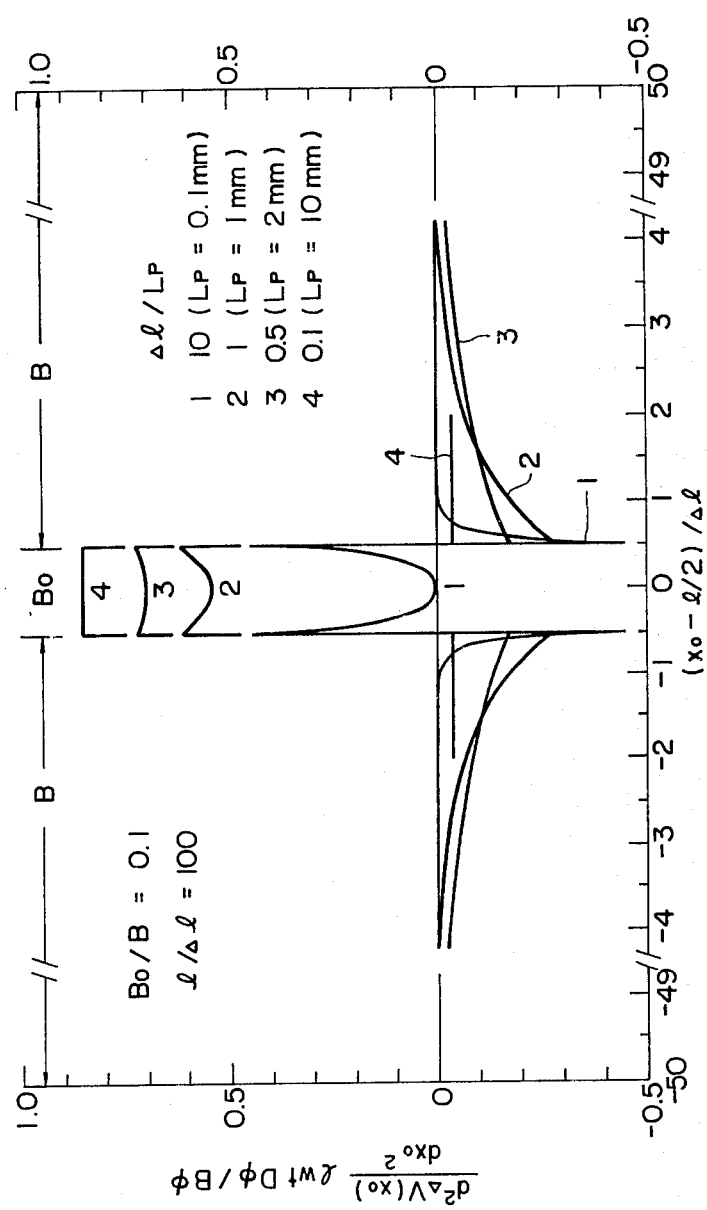
FIG. 3 is a diagram of the relationships between the irradiation point of a photon beam and the photo-voltage as depicted in order to explain the basic principle of this invention.

FIG. 3 illustrates results obtained by subjecting the signals indicated in FIG. 2 to the operation of the 2nd differentiation (both the axes of abscissas and ordinates in FIG. 3 are the same as those in FIG. 2). In the case of $L_p = 10$ mm, the detection of the part having the proportional factor $B_O$ is impossible in FIG. 2, whereas the part having the proportional factor $B_O$ is clearly indicated in FIG. 3. Moreover, the magnitudes of the signals in FIG. 3 are within 2 times in the range of $L_p = 10$ mm–0.1 mm as long as the contour parts are concerned. It can therefore be said that the variation of $10^4$ times shown in FIG. 2 has been removed substantially perfectly. In the image formation, a positive signal is usually used for enhancing the brightness. According to the results of FIG. 3, therefore, when the diffusion length $L_p$ is small, there is the tendency that the signal lowers in the central part, so the recorded image becomes dark apparently.

As thus far described, in the image formation utilizing the photo-voltage or the like, the operation of the 2nd differentiation is greatly effective in point of enhancing the image quality. The effect is based on a special feature in the photovoltaic effect, and has been first found by the inventors this time.

Figure 4:
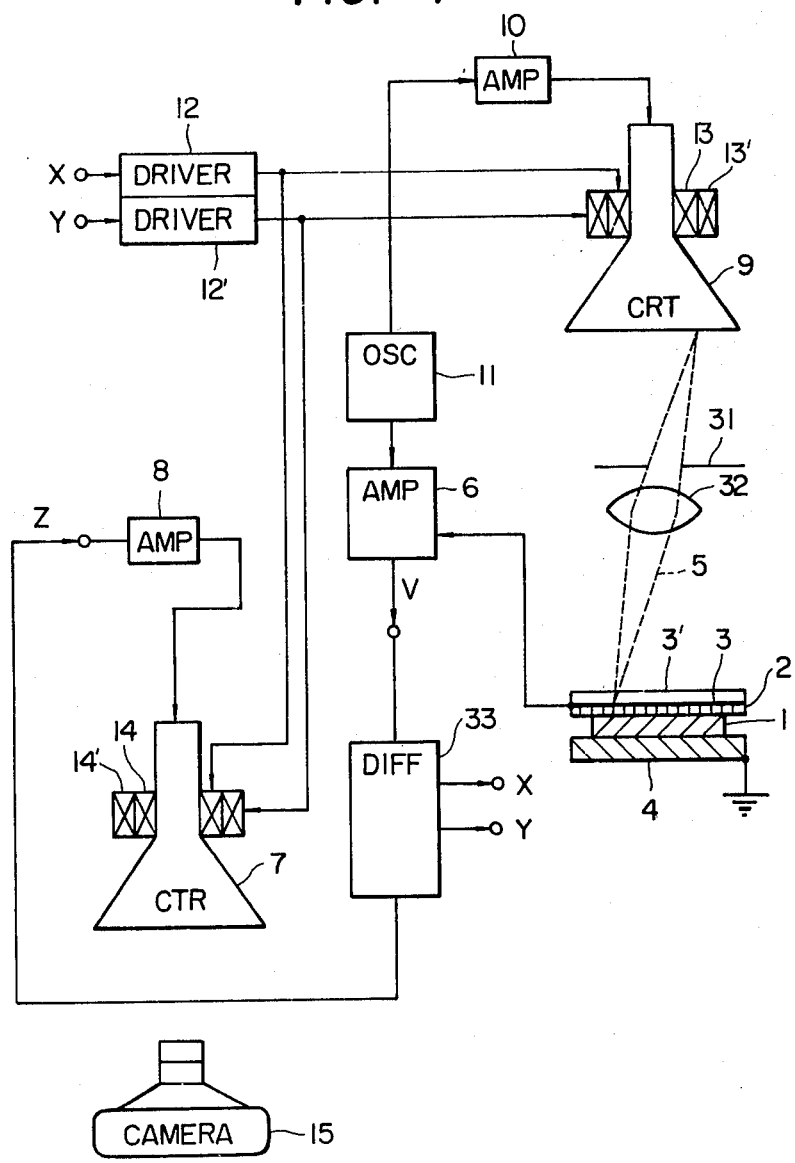
FIG. 4 is a diagram of the fundamental arrangement of a scanning-image forming apparatus using a photo-response signal according to this invention.

FIG. 4 shows the fundamental arrangement of a scanning-image forming apparatus using a photo-response signal according to this invention.

Referring to the figure, a semiconductor specimen 1 to be observed is sandwiched in between a transparent electrode 3 disposed on a glass substrate 3' and a metal electrode 4 through a transparent spacer 2. When, under this state, a photon beam 5 is projected through the transparent electrode 3, a photo-voltage develops across the front and rear surfaces of the semiconductor specimen 1. When the photon beam 5 is pulsed or chopped, also the photo-voltage becomes pulsatile. Therefore, even when an electrode is not formed directly on the front surface of the semiconductor specimen 1, the photo-voltage can be sensed by the transparent electrode 3 through an electrical capacitance which is formed by the spacer 2.

Since the sensed photo-voltage is alternating, it should desirably be demodulated. The sensed voltage is introduced into a demodulating amplifier 6, in which it is demodulated into a D.C. signal. The D.C. signal is supplied to a cathode-ray tube (abbreviated to "CRT") 7 for forming a recorded image. Usually, the output of the demodulating amplifier 6 is introduced into a brightness modulation amplifier 8. In this invention, however, the so-called video signal V being the output of the demodulating amplifier 6 is subjected to the 2nd differentiation by a 2nd derivative circuit 33 to be described later, and the 2nd derivative signal is supplied to the CRT 7 via the brightness modulation amplifier 8 as a brightness modulation signal Z.

The demodulating amplifier 6 is ordinarily made a phase sensitive amplifier for the purposes of enhancing the S/N (signal-to-noise) ratio of the signal and utilizing the phase information of the photo-voltage as the signal. The phase sensitive amplifier demodulates and amplifies the signal in synchronism with the pulse frequency of the photo beam 5, and a lock-in amplifier is mentioned as the amplifier of this type.

On the other hand, the photon beam 5 may of course be a laser beam or the like, but a case of employing a CRT 9 as a light source is illustrated here. Light from the bright spot of the CRT 9 forms the photon beam 5 through an aperture 31 as well as a condenser lens 32. The reason why the CRT 9 is used as the light source is that the pulsing of and the scanning with the photon beam 5 are facilitated. More specifically, the photon beam 5 can be readily pulsed by supplying a signal at an appropriate frequency from an oscillator 11 to a brightness modulation amplifier 10 of the CRT 9. Accordingly, when the signal from the oscillator 11 is supplied to the demodulating amplifier 6, eventually the photo-voltage signal can be demodulated in synchronism with the frequency of the photon beam 5.

In order to deflect and scan the electron beams of the CRT 9 and the CRT 7, appropriate deflection signals may be supplied from deflection signal amplifiers 12 and 12' to deflection coils 13 and 13', and 14 and 14' of the respective CRTs 7 and 9. Thus, the bright spot which moves in synchronism with the photon beam 5 can be formed on the screen of the CRT 7, and a scanning image based on the photo-voltage can be formed on the screen of the CRT 7 at a high resolving power by the photo-voltage signal which has already been supplied. The image is recorded by a camera 15. In the figure, letters X and Y indicate the deflection signals in X- and Y-directions respectively as will be described later.

Figure 5:
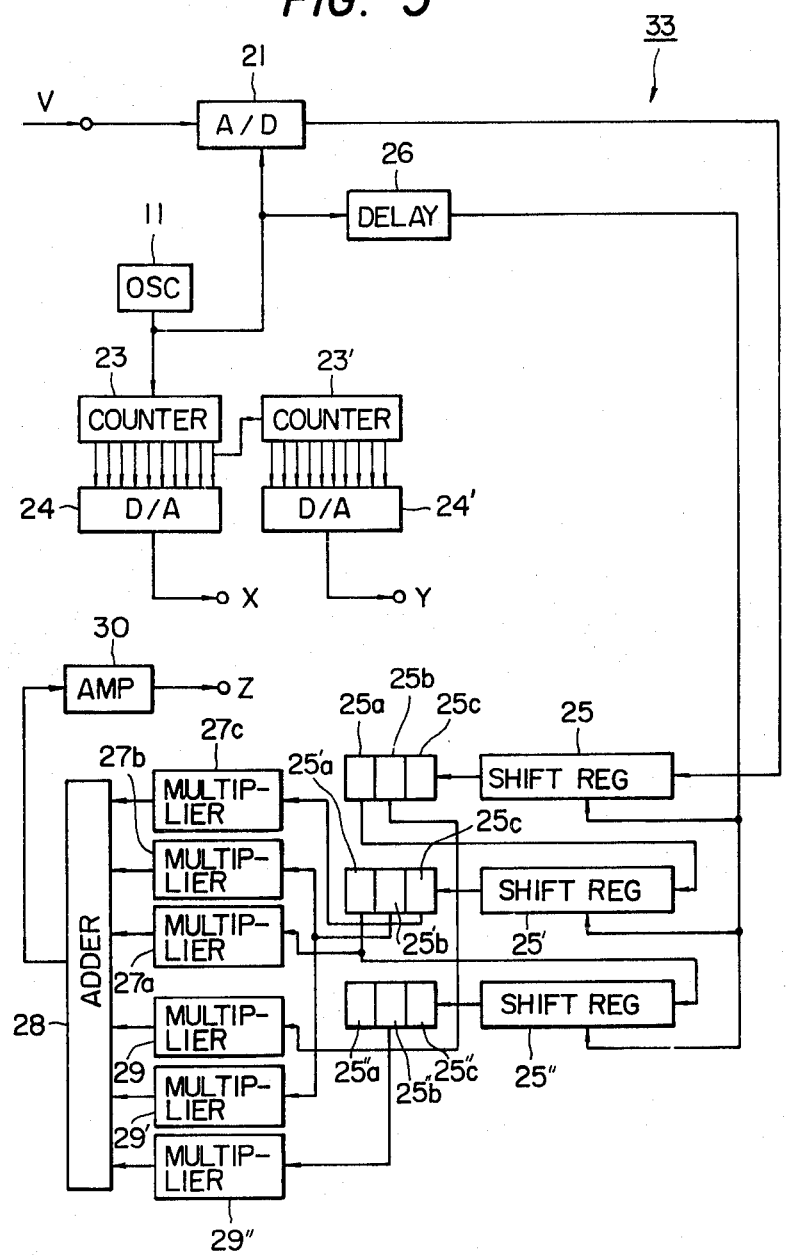
FIG. 5 is a detailed block diagram of a 2nd derivative circuit shown in FIG. 4.

FIG. 5 shows a practicable example of the derivative circuit 33 for obtaining the 2nd derivative signal stated before. In this invention, in order to digitize the signal, the video signal V being an anlog value is converted into a digital value by the use of an A/D (analog-to-digital) converter 21. In the digitization, addressing is made time-sequentially, and hence, the A/D converter 21 is driven with the signal from the oscillator 11 producing the deflection signal of the photon beam 5. The deflection signal is generated in the form of integrating the number of pulses of a clock signal from the oscillator 11. To this end, a 10-bit binary counter 23 is used here. The signal of the counter 23 is converted by a D/A (digital-to-analog) converter 24 into an analog value, which is provided to become the X-directional deflection signal X. When the 10-bit binary counter 23 has counted 515 pulses, it is reset to zero and begins to count again. Therefore, the X-directional deflection signal X becomes a saw-tooth wave. On the other hand, the Y-direction is scanned stepwise every 515th pulse (corresponding to one scanning in the X-direction). Therefore, a 10-bit binary counter 23' is driven by receiving a signal from the final stage of the counter 23 for the X-deflection. Then, when the X-directional deflection signal X is formed, the Y-directional deflection signal Y is similarly formed by a D/A converter 24'. Both the signals X and Y are supplied to the CRT driving circuits 12 and 12' in FIG. 4, respectively.

The video signal converted into the digital value by the A/D converter 21 synchronous with the deflection signal is sent into serially-connected shift registers 25, 25' and 25" in succession at the clock of the deflection signal. The shift registers will be explained here as being of 515 bits in correspondence with the number of digitized points (resolving points), 515 of the deflection signal. It is to be understood, however, that the capacity of the shift registers may be changed at will in correspondence with the number of digitized points of the deflection signal. The so-called depths of the respective bits of the shift registers 25, 25' and 25" need to be varied in accordance with the gray scale of the video signal. Here, they are made 9 bits (division by 512) to the end of conforming with a signal variation of 100 times. Among the 515 time-sequential signals per scanning, three points are especially extracted. The bits of these points are indicated by 25a, 25b and 25c; 25'a, 25'b and 25'c; and 25"a, 25"b and 25"c. The digitized video signal is stored from the A/D converter 21 into the shift registers 25, 25' and 25" with circuit delays. In order to precisely execute the addressing within the shift registers 25, 25' and 25", these shift registers are controlled with the clock signal from the oscillator 11 as passed through a delay circuit 26.

At the point of time when the first scanning in the X-direction has ended, the first signal lies in the bit 25a and the subsequent signals lie in the bits 25b, 25c . . . , and the signals are stored in all the bits of the shift register 25. Next, when the second scanning starts, the signals shift from the bit 25a to the shift register 25'. At the point of time when the second scanning has ended, the first signal of the first scanning lies in the bit 25'a. In this manner, at the point of time when the third scanning has ended, the first signal of the first scanning lies in the bit 25"a, the first signal of the second scanning in the bit 25'a and the first signal of the third scanning in the bit 25a.

From a different viewpoint, under this state, the signals of three points in the X-direction and three points in the Y-direction are arrayed in a manner to surround the bit 25'b.

As is well known in the art of image processing, the 2nd differentiation of a signal is attained by multiplying the signal of a noted point and signals on the left and right thereof by predetermined weighting coefficients and then combining the resultant signals. More specifically, in the X-direction, the signal of the bit $25'b$ and the signals of the bits $25'a$ and $25'c$ on the left and right thereof are multiplied by predetermined coefficients with multipliers $27b$, $27a$ and $27c$ respectively, and the resultant signals are summed up with an adder 28. Since the 2nd differentiation is similarly required in the Y-direction, the signals of the bit $25'b$ and of the bits $25b$ and $25''b$ over and under the bit $25'b$ are multiplied by weights with multipliers $29'$, $29$ and $29''$ respectively, and the resultant signals are summed up with the adder 28.

Thus, the 2nd differentiation is completed as to the second point of the second scanning. An output from the adder 28 may be subjected to an impedance change by an amplifier 30 whose output is transmitted to the brightness modulation circuit 8 of the image forming CRT 7 as the brightness modulation signal Z.

Upon initiation of the fourth scanning, the differential operation shifts to the third point of the second scanning. Thus, derivative signals are consecutively formed in succession.

In this case, obviously the first scanning signal and the last 515th scanning signal cannot be differentiated. Likewise, the initial point and the terminal point cannot be differentiated in each scanning. However, both are 2/515, and no special hindrance is formed even when such extent of information are lost from the recorded image.

As described above in detail, according to this invention, a scanning image can be formed at a high resolving power having hitherto been unattainable, and this is greatly effective in practical use. Although, in the foregoing embodiment, the signal based on the photo-voltage has been especially explained among photo-response signals generated from a semiconductor specimen by the irradiation with light, it is a matter of course that the invention is not restricted thereto but that it is also applicable to a photo-current, the photoconductive effect etc.

We claim:

1. A scanning-image forming apparatus using a photo-response signal, comprising photon beam generation means for generating a photon beam, photon beam scanning means for scanning a surface of a semiconductor specimen with said photon beam in a pattern defined by movement of said beam in orthogonal directions, detection means for detecting the photo-response signal generated in said semiconductor specimen by the scanning with said photon beam, amplification means for amplifying the detected photo-response signal, differential means for providing a 2nd derivative of the amplified photo-response signal along said orthogonal directions, and display means for displaying an image by employing said 2nd derivative of said photo-response signal as a modulation signal.

2. A scanning-image forming apparatus using a photo-response signal as defined in claim 1, wherein said photon beam is a photon beam which is pulsed at a fixed frequency.

3. A scanning-image forming apparatus using a photo-response signal as defined in claim 1, wherein said photo-response signal is a photo-voltage signal which develops across front and rear surfaces of said semiconductor specimen.

4. A scanning-image forming apparatus using a photo-response signal as defined in claim 1, wherein said photon beam generation means is provided with a cathode-ray tube.

5. A scanning-image forming apparatus using a photo-response signal as defined in claim 2, wherein said photon beam generation means is provided with a cathode-ray tube whose brightness is modulated by said fixed frequency.

6. A scanning-image forming apparatus using a photo-response signal as defined in claim 1, wherein said photon beam scanning means is provided with a cathode-ray tube which is deflected by deflection signals.

7. A scanning-image forming apparatus using a photo-response signal as defined in claim 1, wherein said detection means includes a transparent electrode disposed on a front surface side of said semiconductor specimen, and a metal electrode disposed on a rear surface side thereof.

8. A scanning-image forming apparatus using a photo-response signal as defined in claim 2, wherein said amplification means is provided with a lock-in amplifier which uses said fixed frequency as its reference signal.

9. A scanning-image forming apparatus using a photo-response signal as defined in claim 1, wherein said display means is provided with a cathode-ray tube.

10. A scanning-image forming apparatus for reproducing an image which is part of a semiconductor specimen with high resolution comprising photon beam generation means for generating a photon beam, photon beam scanning means for scanning a surface of the semiconductor specimen containing the image with said photon beam in a pattern defined by a movement of said beam in orthogonal directions, detection means for detecting a photo-response signal generated in said semiconductor specimen by the scanning of the image with said photon beam, amplification means for amplifying the detected photo-response signal, differential means for providing a 2nd derivative of the amplified photo-response signal along said orthogonal directions, and display means for displaying an image by employing said 2nd derivative of said photo-response signal as a modulation signal.

11. A scanning-image forming apparatus using a photo-response signal as defined in claim 10, wherein said photon beam is a photon beam which is pulsed at a fixed frequency.

12. A scanning-image forming apparatus using a photo-response signal as defined in claim 10, wherein said photo-response signal is a photo-voltage signal which develops across front and rear surfaces of said semiconductor specimen.

13. A scanning-image forming apparatus using a photo-response signal as defined in claim 10, wherein said photon beam generation means is provided with a cathode-ray tube.

14. A scanning-image forming apparatus using a photo-response signal as defined in claim 11, wherein said photon beam generation means is provided with a cathode-ray tube whose brightness is modulated by said fixed frequency.

15. A scanning-image forming apparatus using a photo-response signal as defined in claim 10, wherein said photon beam scanning means is provided with a cathode-ray tube which is deflected by deflection signals.

16. A scanning-image forming apparatus using a photo-response signal as defined in claim 10, wherein said detection means includes a transparent electrode disposed on a front surface side of said semiconductor specimen, and a metal electrode disposed on a rear surface side thereof.

17. A scanning-image forming apparatus using a photo-response signal as defined in claim 11, wherein said amplification means is provided with a lock-in amplifier which uses said fixed frequency as its reference signal.

18. A scanning-image forming apparatus using a photo-response signal as defined in claim 10, wherein said display means is provided with a cathode-ray tube.

* * * * *